(12) United States Patent
Lu

(10) Patent No.: US 12,191,319 B2
(45) Date of Patent: Jan. 7, 2025

(54) PANEL AND MANUFACTURING METHOD THEREOF

(71) Applicants: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

(72) Inventor: Macai Lu, Huizhou (CN)

(73) Assignees: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 583 days.

(21) Appl. No.: 17/598,868

(22) PCT Filed: Jul. 9, 2021

(86) PCT No.: PCT/CN2021/105441
§ 371 (c)(1),
(2) Date: Sep. 27, 2021

(87) PCT Pub. No.: WO2022/257218
PCT Pub. Date: Dec. 15, 2022

(65) Prior Publication Data
US 2023/0238401 A1    Jul. 27, 2023

(30) Foreign Application Priority Data
Jun. 10, 2021    (CN) .......................... 202110646393.3

(51) Int. Cl.
H01L 27/12    (2006.01)
H01L 25/16    (2023.01)
(Continued)

(52) U.S. Cl.
CPC ........ H01L 27/1251 (2013.01); H01L 25/167 (2013.01); H01L 27/127 (2013.01);
(Continued)

(58) Field of Classification Search
CPC . H01L 27/1251; H01L 25/167; H01L 27/127; H01L 33/505; H01L 33/62;
(Continued)

(56) References Cited

U.S. PATENT DOCUMENTS

2017/0294565 A1    10/2017    Kim
2019/0319076 A1*   10/2019    Lee ..................... H10K 50/844
(Continued)

FOREIGN PATENT DOCUMENTS

CN    105070744 A    11/2015
CN    108183156 A    6/2018
(Continued)

OTHER PUBLICATIONS

Chinese Office Action issued in corresponding Chinese Patent Application No. 202110646393.3 dated Jun. 6, 2022, pp. 1-10.
(Continued)

*Primary Examiner* — Karen Kusumakar
*Assistant Examiner* — Shawn Shaw Muslim
(74) *Attorney, Agent, or Firm* — PV IP PC; Wei Te Chung

(57) ABSTRACT

An embodiment of the application discloses a panel and a manufacturing method thereof. In the panel, a thin-film transistor layer, a first conductive layer, a light-emitting diode (LED), and a second conductive layer are sequentially disposed on a substrate. The LED includes a first end and a
(Continued)

second end. The first end is disposed on the first electrode. The second end is disposed on the second electrode. The second conductive layer includes a first conductive portion and a second conductive portion. The first conductive portion is electrically connected to the first end and the first electrode. The second conductive portion is electrically connected to the second end and the second electrode.

20 Claims, 9 Drawing Sheets

(51) Int. Cl.
*H01L 33/50* (2010.01)
*H01L 33/62* (2010.01)

(52) U.S. Cl.
CPC ............ *H01L 33/505* (2013.01); *H01L 33/62* (2013.01); *H01L 2933/0041* (2013.01); *H01L 2933/0066* (2013.01)

(58) Field of Classification Search
CPC ..... H01L 2933/0041; H01L 2933/0066; H01L 33/005; H01L 33/50; H01L 27/156; H01L 25/0753; H01L 27/1214; H01L 27/1259; G09F 9/33
See application file for complete search history.

(56) References Cited

U.S. PATENT DOCUMENTS

| | | | |
|---|---|---|---|
| 2019/0392751 | A1 | 12/2019 | Hsieh |
| 2020/0105792 | A1 | 4/2020 | Lee |
| 2021/0398952 | A1* | 12/2021 | Zhang ............... H01L 29/78633 |

FOREIGN PATENT DOCUMENTS

| | | |
|---|---|---|
| CN | 110047866 A | 7/2019 |
| CN | 111584507 A | 8/2020 |
| CN | 111952331 A | 11/2020 |
| CN | 112420745 A | 2/2021 |
| EP | 3553821 A1 | 10/2019 |
| WO | 2017078441 A1 | 5/2017 |
| WO | 2017160119 A1 | 9/2017 |

OTHER PUBLICATIONS

International Search Report in International application No. PCT/CN2021/105441, mailed on Mar. 9, 2022.
Written Opinion of the International Searching Authority in International application No. PCT/CN2021/105441, mailed on Mar. 9, 2022.

* cited by examiner

PANEL AND MANUFACTURING METHOD THEREOF

RELATED APPLICATIONS

This application is a Notional Phase of PCT Patent Application No. PCT/CN2021/105441 having international filing date of Jul. 9, 2021, which claims the benefit of priority of Chinese Patent Application No. 202110646393.3 filed on Jun. 10, 2021. The contents of the above applications are all incorporated by reference as if fully set forth herein in their entirety.

FIELD OF INVENTION

The present application is related to the field of display technology and specifically to a panel and a manufacturing method thereof.

BACKGROUND OF INVENTION

In a process of research and practice of prior art, the inventor of the present application found that manufacturing processes of mini light-emitting diodes (mini-LEDs) and micro light-emitting diodes (micro-LEDs) are relatively complicated. Currently, the micro-LEDs have low maturity of massive transfer, low reliability, and high costs, and their large-size manufacturing processes are extremely difficult, thereby causing negative impacts on future development.

A material of a light-emitting layer in an electroluminescent display panel is generally an organic material or a quantum dot material. A light-emitting life of the above-mentioned materials is relatively short, especially materials that emit blue light. Therefore, it is necessary to provide a display panel with new display technology to reduce a process difficulty and increase a service life of the display panel.

SUMMARY OF INVENTION

The present application provides a panel which can increase a service life of the panel and simplify a process.

The present application provides a panel, including:
a substrate;
a thin-film transistor layer disposed on the substrate and including a plurality of thin-film transistors;
a first conductive layer disposed on the thin-film transistor layer and including a first electrode and a second electrode separated from each other, wherein the first electrode is electrically connected to one of the thin-film transistors;
a pixel defining layer disposed on the first conductive layer and provided with an opening;
at least one light-emitting diode (LED) disposed in the opening, wherein the LED includes a first end and a second end opposite to each other, the first end is disposed on the first electrode, and the second end is disposed on the second electrode; and
a second conductive layer disposed on the LED and including a first conductive portion and a second conductive portion, wherein the first conductive portion is electrically connected to the first end and the first electrode, and the second conductive portion is electrically connected to the second end and the second electrode.

Optionally, in an embodiment of the present application, the panel further includes an insulating material, wherein the opening includes a first opening, the LED is disposed in the first opening, and the insulating material is disposed in the first opening and covers the LED, part of the second conductive portion, and the first conductive portion.

Optionally, in an embodiment of the present application, the first conductive layer further includes a third electrode, the opening further includes a second opening, and the second opening exposes the third electrode; and
the panel further includes a light-emitting layer and a fourth electrode, the light-emitting layer is disposed in the second opening, the fourth electrode covers the pixel defining layer, the light-emitting layer, and the insulating material, and the fourth electrode is connected to the second conductive portion.

Optionally, in an embodiment of the present application, the LED includes a blue LED, and the light-emitting layer includes a red light-emitting layer and a green light-emitting layer.

Optionally, in an embodiment of the present application, the thin-film transistors include a first thin-film transistor and a second thin-film transistor, the thin-film transistor layer further includes a common line, the first thin-film transistor is electrically connected to the first electrode, the common line is electrically connected to the second electrode, and the second thin-film transistor is electrically connected to the third electrode.

Optionally, in an embodiment of the present application, the panel further includes a fixing portion disposed in the opening and fixedly connected to the LED, the first electrode, and the second electrode.

Optionally, in an embodiment of the present application, the fixing portion includes a fixing material and a material configured to block etching.

Optionally, in an embodiment of the present application, the panel further includes a light conversion layer disposed in the opening and covering the LED.

Optionally, in an embodiment of the present application, the LED further includes a semiconductor layer and a protective layer, the semiconductor layer is connected between the first end and the second end, and the protective layer covers the semiconductor layer, at most covers part of the first end, and at most covers part of the second end.

Optionally, in an embodiment of the present application, the pixel defining layer covers part of the first conductive portion and part of the second conductive portion.

Optionally, in an embodiment of the present application, the LED further includes a semiconductor layer connected between the first end and the second end; and
the first conductive portion and the second conductive portion are not connected to the semiconductor layer.

Optionally, in an embodiment of the present application, the LED further includes a protective layer covering the semiconductor layer, at most covering part of the first end, and at most covering part of the second end.

Optionally, in an embodiment of the present application, a material of the second conductive layer includes one of a metal oxide, a metal, an alloy, a compound, or a combination thereof.

Optionally, in an embodiment of the present application, the LED includes a nano-LED.

Correspondingly, the present application further relates to a manufacturing method of a panel, including steps of:
forming a thin-film transistor layer on the substrate;
forming a patterned first conductive layer on the thin-film transistor layer, wherein the first conductive layer includes a first electrode and a second electrode separated from each other;

disposing at least one LED on the first conductive layer, aligning the first electrode and a first end of the LED, and aligning the second electrode and a second end of the LED, wherein the first end and the second end are opposite to each other; and forming a patterned second conductive layer on the LED, wherein the second conductive layer includes a first conductive portion and a second conductive portion, the first conductive portion is electrically connected to the first end and the first electrode, and the second conductive portion is electrically connected to the second end and the second electrode.

Optionally, in an embodiment of the present application, the first conductive layer further includes a third electrode; before the step of disposing at least one LED on the first conductive layer, the manufacturing method of the panel further includes a step of:

forming a patterned pixel defining layer and an opening on the first conductive layer, wherein the opening includes a first opening and a second opening, the first opening exposes the first electrode and the second electrode, and the second opening exposes the third electrode;

after the step of forming the patterned second conductive layer on the LED, the manufacturing method of the panel further includes steps of:

filling an insulating material in the first opening to cover the LED, part of the second conductive portion, and the first conductive portion, wherein part of the second conductive portion is exposed;

forming a light-emitting layer in the second opening; and sequentially forming a fourth electrode and an encapsulation layer on the pixel defining layer, the light-emitting layer, and the insulating material, wherein the fourth electrode is connected to the second conductive portion.

Optionally, in an embodiment of the present application, before the step of disposing at least one LED on the first conductive layer, the manufacturing method of the panel further includes a step of:

forming a patterned sacrificial layer and a first opening on the first conductive layer, wherein the first opening exposes the first electrode and the second electrode;

the step of disposing at least one LED on the first conductive layer, aligning the first electrode and the first end of the LED, and aligning the second electrode and the second end of the LED includes steps of:

disposing an LED solution in the first opening to cover the first conductive layer, wherein the LED solution includes the LED, a solvent, a fixing material, and a material configured to block etching;

aligning the first electrode and the first end of the LED and aligning the second electrode and the second end of the LED; and drying the LED solution and removing the solvent to enable the LED to be fixed on the thin-film transistor layer by the fixing material.

Optionally, in an embodiment of the present application, after the step of drying the LED solution, the manufacturing method of the panel further includes steps of:

removing the sacrificial layer; and forming a patterned photoresist layer on the thin-film transistor layer, wherein a material exposed on the first conductive layer and the LED are etched by configuring the photoresist layer as a mask, the photoresist layer is provided with a second opening and a third opening, the second opening corresponds to the first electrode and the first end of the LED, and the third opening corresponds to the second electrode and the second end of the LED.

Optionally, in an embodiment of the present application, the photoresist layer includes an undercut structure; and the step of forming the patterned second conductive layer on the LED includes steps of:

forming a conductive material layer on the photoresist layer to cover the first electrode, the first end of the LED, the second electrode, and the second end of the LED; and removing the photoresist layer and forming the patterned second conductive layer to enable the first conductive portion to be electrically connected to the first end and the first electrode and enable the second conductive portion to be electrically connected to the second end and the second electrode.

Optionally, in an embodiment of the present application, after the step of removing the photoresist layer, the manufacturing method of the panel further includes steps of:

forming a pixel defining layer on the second conductive layer, wherein the pixel defining layer is provided with a fourth opening, and the fourth opening exposes the LED; and forming a light conversion layer in the fourth opening and followed by forming an encapsulation layer on the light conversion layer.

In an embodiment of the present application, the first conductive layer, the pixel defining layer, the at least one LED, and the second conductive layer are sequentially disposed on the thin-film transistor layer. The first conductive layer includes the first electrode and the second electrode that are separated from each other. The first electrode is electrically connected to the thin-film transistor. The pixel defining layer is provided with the openings. The LED is disposed in the opening. The LED includes the first end and the second end that are opposed to each other. The first end is disposed on the first electrode. The second end is disposed on the second electrode. The second conductive layer includes the first conductive portion and the second conductive portion. The first conductive portion is electrically connected to the first end and the first electrode. The second conductive portion is electrically connected to the second end portion and the second electrode. In this embodiment, a structural-replaced LED chip of an LED different from LED chips in a mini-LED panel and a micro-LED panel is adopted, so as to achieve an effect of simplifying the process. In addition, adopting an LED light-emitting structure has a longer service life compared to a simple electroluminescent display panel.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF EMBODIMENTS

The technical solution of the present application embodiment will be clarified and completely described with reference accompanying drawings in embodiments of the present application embodiment. Obviously, the present application described parts of embodiments instead of all of the embodiments. Based on the embodiments of the present application, other embodiments which can be obtained by a person skilled in the art without creative efforts fall into the protected scope of the present application. In addition, it should be understood that specific implementations described here are only used to illustrate and explain the present application and are not used to limit the present application. In the present application, if no explanation is made to the contrary, orientation words such as "upper" and "lower" usually refer to upper and lower directions of a device in an actual use or a working state and specifically refer to drawing directions in drawings. Also, "inner" and "outer" refer to an outline of the device.

Embodiments of the present application provide a panel and a manufacturing method thereof, which can be described in detail as follow. It should be noted that an order of description of the embodiments in the following is not meant to limit a preferred order of the embodiments.

Figure 1:
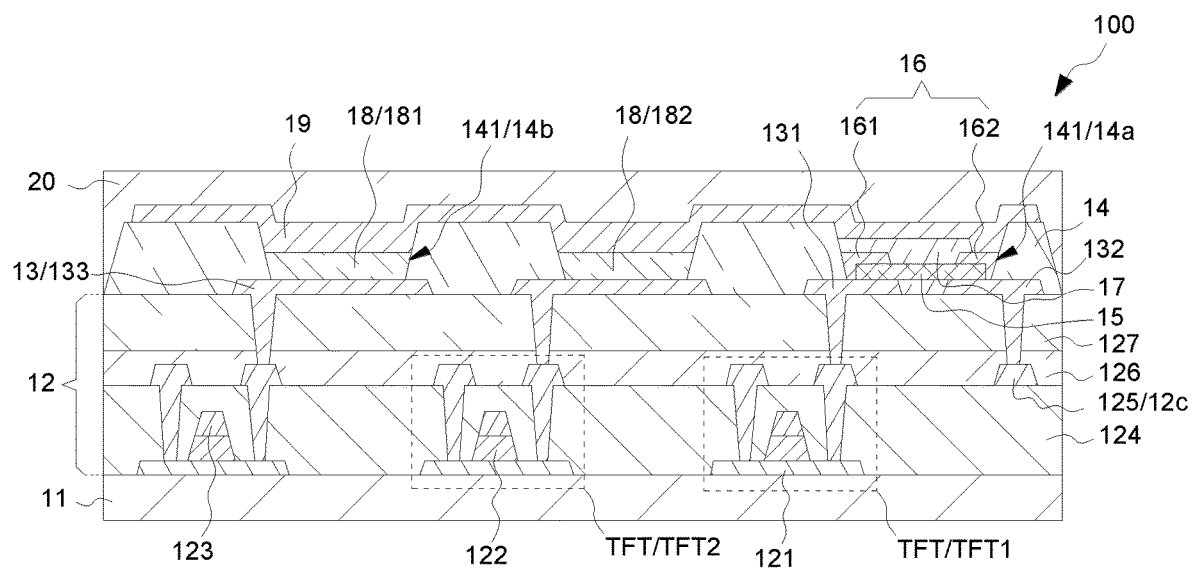
FIG. 1 is a schematic diagram of a first structure of a panel provided by an embodiment of the present application.
Figure 2:
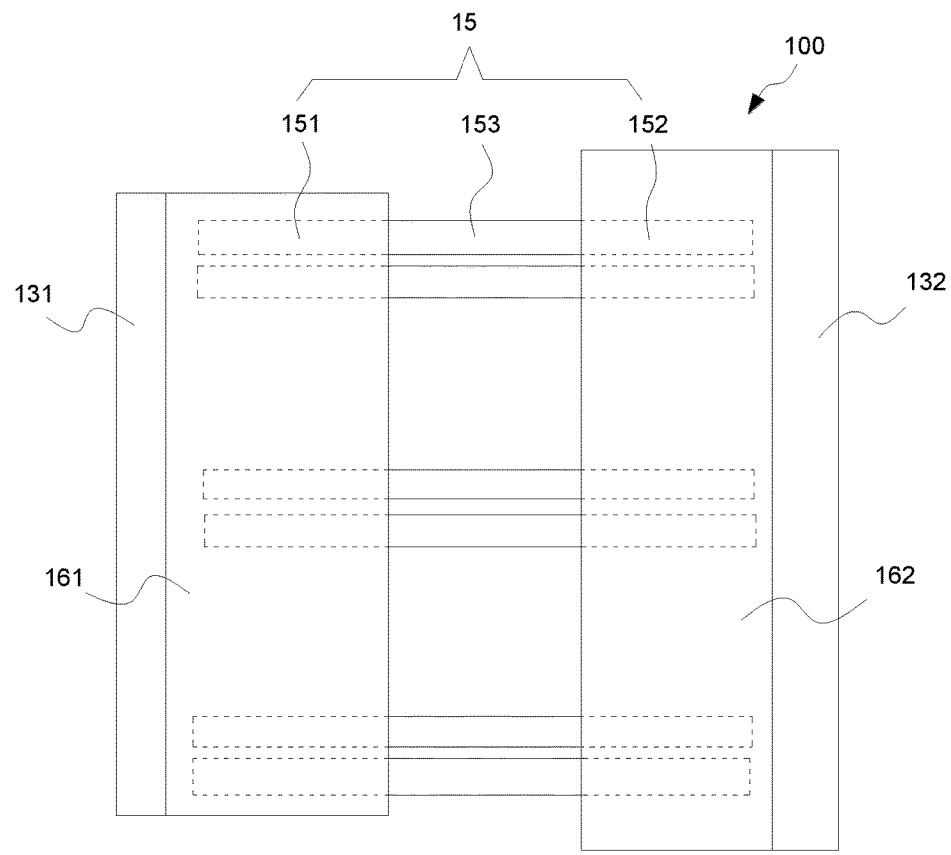
FIG. 2 is a top view of part of the first structure of the panel provided by an embodiment of the present application.

Referring to FIGS. 1 and 2, an embodiment of the present application provides a panel 100 including a substrate 11, a thin-film transistor layer 12, a first conductive layer 13, a pixel defining layer 14, at least one light-emitting diode (LED) layer 15, and a second conductive layer 16.

The thin-film transistor layer 12 is disposed on the substrate 11. The thin-film transistor layer 12 includes a plurality of thin-film transistors TFT.

The first conductive layer 13 is disposed on the thin-film transistor layer 12. The first conductive layer 13 includes a first electrode 131 and a second electrode 132 separated from each other. The first electrode 131 is electrically connected to a thin-film transistor TFT.

The pixel defining layer 14 is disposed on the first conductive layer 13. The pixel defining layer 14 is provided with an opening 141.

Figure 3:
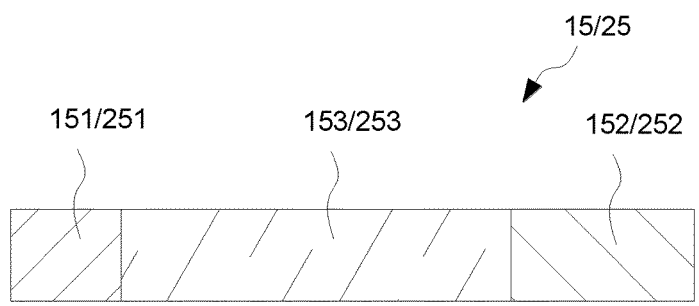
FIG. 3 is a first structural schematic diagram of an LED of the panel provided by an embodiment of the present application.
Figure 4:
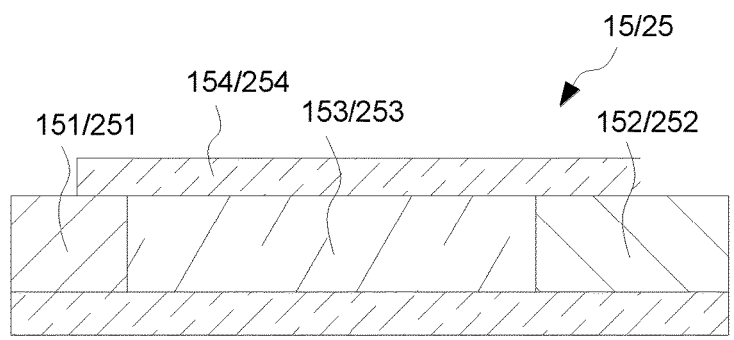
FIG. 4 is a second structural schematic diagram of the LED of the panel provided by an embodiment of the present application.

The LED 15 is disposed in the opening 141. The LED 15 includes a first end 151 and a second end 152 disposed opposite to each other, as shown in FIG. 3 or FIG. 4. The first end 151 is disposed on the first electrode 131, and the second end 152 is disposed on the second electrode 132.

The second conductive layer 16 is disposed on the LED 15. The second conductive layer 16 includes a first conductive portion 161 and a second conductive portion 162. The first conductive portion 161 is electrically connected to the first end portion 151 and the first electrode 131. The second conductive portion 162 is electrically connected to the second end portion 152 and the second electrode 132.

An embodiment of the present application adopts a structure of the LED 15 being disposed on the thin-film transistor layer 12 that replaces a mini-LED panel and a micro-LED panel in prior art, so as to achieve an effect of simplifying a process. In addition, the above-mentioned structure has a longer service life than a simple electroluminescent display panel.

Optionally, the substrate 11 can be a rigid substrate or a flexible substrate. A material of the substrate 11 includes one of glass, sapphire, silicon, silicon dioxide, polyethylene, polypropylene, polystyrene, polylactic acid, polyethylene terephthalate, polyimide, or polyurethane.

Optionally, the thin-film transistor TFT can be a top gate thin-film transistor or a bottom gate thin-film transistor. The thin-film transistor TFT can be a P-type thin-film transistor or an N-type thin-film transistor.

The embodiments of the present application are described by taking an N-type top gate thin-film transistor as the thin-film transistor TFT as an example, but is not limited thereto.

Optionally, the thin-film transistor layer 12 includes an active layer 121, a gate insulating layer 122, a first metal layer 123, an interlayer dielectric layer 124, a second metal layer 125, a first flat layer 126, and a second flat layer 127 sequentially disposed on the substrate 11.

The first metal layer 123 includes a gate. The second metal layer 125 includes a source, a drain, and a common line 12c.

The drain is connected to the first electrode 131. The common line 12c is connected to the second electrode 132.

The active layer 121, the gate, the source, and the drain form the thin-film transistor TFT.

Optionally, materials of the first metal layer 123 and the second metal layer 125 can be pure metals or alloys, such as gold, silver, tungsten, molybdenum, iron, aluminum, aluminum-silicon, aluminum-titanium, etc.

Optionally, materials of the gate insulating layer 122 can include at least one of silicon nitride, silicon oxide, or organic photoresist.

Optionally, materials of the first flat layer 126 and the second flat layer 127 can be an organic transparent film layer, such as transparent photoresist, epoxy resin, polyimide, polyvinyl alcohol, polymethylmethacrylate, polystyrene, etc.

Optionally, materials of the first conductive layer 13 and the second conductive layer 16 can be oxides, such as indium tin oxide, indium zinc oxide, etc., and can also be metals, alloys, compounds, and mixtures thereof with various conductive properties. For example, gold, silver, platinum, etc. can be used.

Optionally, the at least one LED 15 includes a nano-LED.

Optionally, a length of the LED 15 ranges from 2 to 5 micrometers. For example, it can be 2 micrometers, 3 micrometers, 4 micrometers, or 5 micrometers. The width ranges from 100 to 500 nanometers. For example, it can be 100 nanometers, 200 nanometers, 300 nanometers, 400 nanometers, or 500 nanometers. The LED 15 is a rod-shaped structure, but is not limited thereto.

Optionally, referring to FIG. 3, the LED 15 further includes a semiconductor layer 153. The semiconductor layer 153 is connected between the first end 151 and the second end 152. The first end 151 is one of a P-type semiconductor and an N-type semiconductor. The second end 152 is the other one of the P-type semiconductor and the N-type semiconductor.

Optionally, neither the first conductive portion 161 nor the second conductive portion 162 is connected to the semiconductor layer 153 to prevent short circuits.

Referring to FIG. 4, the LED 15 can further include a protective layer 154. The protective layer 154 covers the semiconductor layer 153 and at most covers part of the first end 151 and at most covers part of the second end 152. That is to say, the LED 15 exposes at least part of the first end 151 and exposes at least part of the second end 152.

Optionally, in an embodiment of the present application, the panel 100 can further include an insulating material 17. The opening 141 includes a first opening 14a, and the LED 15 is disposed in the first opening 14a. The insulating material 17 is disposed in the first opening 14a and covers the LED 15, part of the second conductive portion 162, and the first conductive portion 161.

In this embodiment, the insulating material 17 is adopted to package the LED 15, so that the first end 151 of the LED 15 connecting the thin-film transistor TFT is covered by the insulating material 17, and the second end 152 on another side is at least partially exposed.

In an embodiment of the present application, the first conductive layer 13 further includes a third electrode 133. The opening 141 further includes a second opening 14b. The second opening 14b exposes the third electrode 133.

The panel 100 further includes a light-emitting layer 18 and a fourth electrode 19. The light-emitting layer 18 is disposed in the second opening 14b. The fourth electrode 19 covers the pixel defining layer 14, the light-emitting layer 18, and the insulating material 17. The fourth electrode 19 is connected to the second conductive portion 162.

In this embodiment, the thin-film transistors TFT can further include a first thin-film transistor TFT1 and a second thin-film transistor TFT2. The first thin-film transistor TFT1 is electrically connected to the first electrode 131. The second thin-film transistor TFT2 is electrically connected to the third electrode 133.

Optionally, a material of the light-emitting layer 18 can be an organic material, such as Alq3, bis(8-hydroxy-2-methylquinoline)-(4-phenylphenoxy)aluminum (BAlq), DPVBi, Almq3, or 3-tert-butyl-9,10-bis(2-naphthalene)anthracene (TBADN).

The material of the light-emitting layer 18 can also be an inorganic material. For example, it can be selected from one or more of group IV semiconductor nanocrystals, group II-V semiconductor nanocrystals, group II-VI semiconductor nanocrystals, group IV-VI semiconductor nanocrystals, group III-V semiconductor nanocrystals, or III-VI group semiconductor nanocrystals. For example, it can be one or more of silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, or gallium nitride quantum dots.

Optionally, the fourth electrode 19 can be indium tin oxide, indium zinc oxide, or other oxides.

The embodiment of the present application adopts a light-emitting structure of LED hybrid electroluminescence. Compared to the mini-LED panel, this embodiment prevents steps of massive transfer and simplifies the process. Compared with a pure electroluminescent panel, this embodiment has a longer service life.

In prior art, since a service life of blue quantum dots electroluminescence is much shorter than a service life of red and green quantum dots, the electroluminescent panel has a color shift as light emission of the blue quantum dots attenuate, thereby causing display failure.

Therefore, in an embodiment of the present application, optionally, the LED 15 can be a blue light-emitting LED. The light-emitting layer 18 can include a red light-emitting layer 181 and a green light-emitting layer 182. Since a light-emitting performance of the LED 15 is better than a light-emitting performance of the blue quantum dots, the red quantum dots and the green quantum dots are adopted as the light-emitting layer 18. Adopting the blue light-emitting LED 15 to replace the blue quantum dots can achieve matching of performance and the service life, thereby enhancing an overall service life and taste of the panel 100.

The panel 100 of this embodiment can further include an encapsulation layer 20'. The encapsulation layer 20 is provided on the pixel defining layer 14, the light-emitting layer 18, and the insulating material 17.

Figure 5:
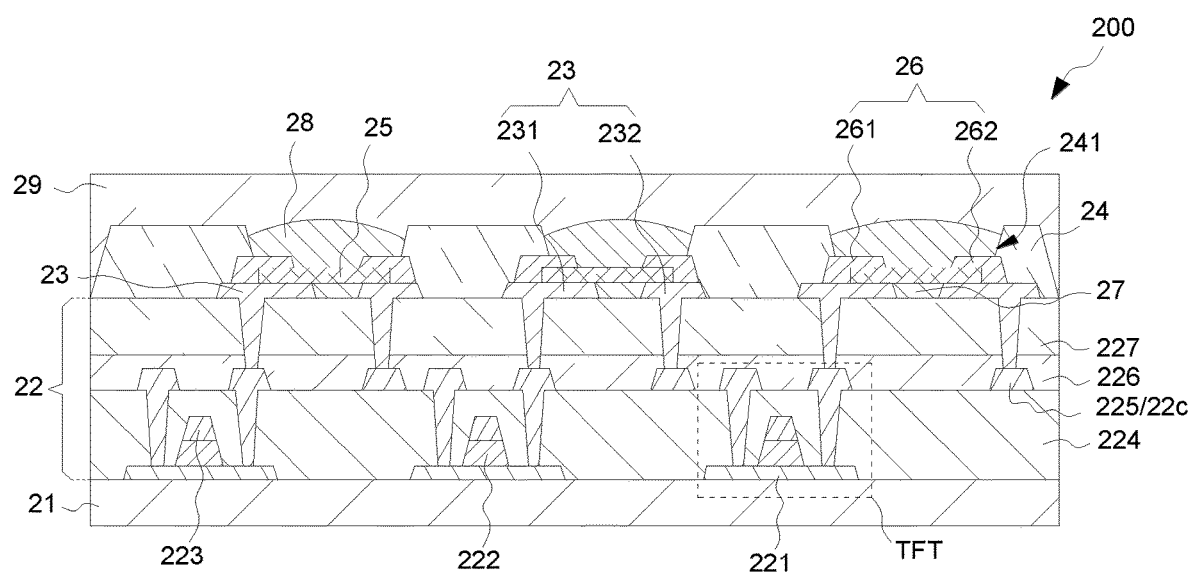
FIG. 5 is a schematic diagram of a second structure of a panel provided by an embodiment of the present application.

Referring to FIG. 5, an embodiment of the present application provides a panel 200 including a substrate 21, a thin-film transistor layer 22, a first conductive layer 23, a pixel defining layer 24, at least one light-emitting diode (LED) 25, and a second conductive layer 26.

The thin-film transistor layer 22 is disposed on the substrate 21. The thin-film transistor layer 22 includes a plurality of thin-film transistors TFT.

The first conductive layer 23 is disposed on the thin-film transistor layer 22. The first conductive layer 23 includes a first electrode 231 and a second electrode 232 separated from each other. The first electrode 231 is electrically connected to a thin-film transistor TFT.

The pixel defining layer 24 is disposed on the first conductive layer 23. The pixel defining layer 24 is provided with an opening 241.

Figure 6:
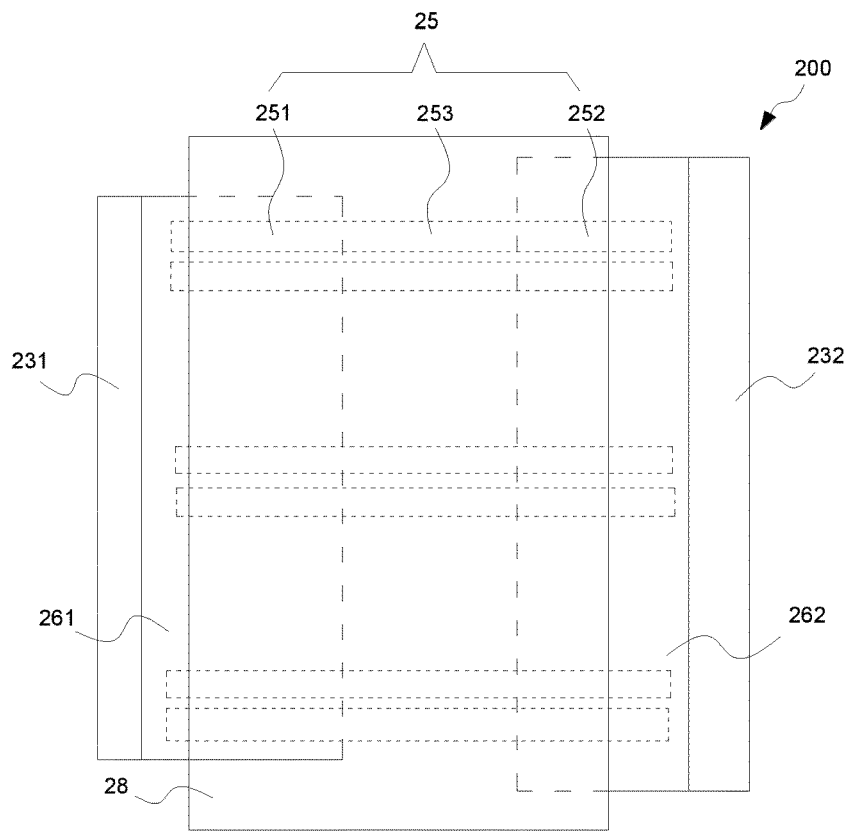
FIG. 6 is a top view of part of the second structure of the panel provided by an embodiment of the present application.

The LED 25 is disposed in the opening 241. The LED 25 includes a first end 251 and a second end 252 disposed opposite to each other, as shown in FIG. 6. The first end 251 is disposed on the first electrode 231, and the second end 252 is disposed on the second electrode 232.

The second conductive layer 26 is disposed on the LED 25. The second conductive layer 26 includes a first conductive portion 261 and a second conductive portion 262, and the first conductive portion 261 is electrically connected to the first end portion 251 and the first electrode 231. The second conductive portion 262 is electrically connected to the second end portion 252 and the second electrode 232.

An embodiment of the present application adopts a structure of the LED 25 being disposed on the thin-film transistor layer 22 that replaces a mini-LED panel and a micro-LED panel in prior art, so as to achieve an effect of simplifying a process. In addition, the above-mentioned structure has a longer service life than a simple electroluminescent display panel.

Optionally, the substrate 21 can be a rigid substrate or a flexible substrate. A material of the substrate 21 includes one of glass, sapphire, silicon, silicon dioxide, polyethylene, polypropylene, polystyrene, polylactic acid, polyethylene terephthalate, polyimide, or polyurethane.

Optionally, the thin-film transistor TFT can be a top gate thin-film transistor or a bottom gate thin-film transistor. The thin-film transistor TFT can be a P-type thin-film transistor or an N-type thin-film transistor.

The embodiments of the present application are described by taking an N-type top gate thin-film transistor as the thin-film transistor TFT as an example, but is not limited thereto.

Optionally, the thin-film transistor layer 22 includes an active layer 221, a gate insulating layer 222, a first metal layer 223, an interlayer dielectric layer 224, a second metal layer 225, a first flat layer 226, and a second flat layer 227 sequentially disposed on the substrate 11.

The first metal layer 223 includes a gate. The second metal layer 125 includes a source, a drain, and a common line 22c.

The drain is connected to the first electrode 231. The common line 12c is connected to the second electrode 232.

The active layer 221, the gate, the source, and the drain form the thin-film transistor TFT.

Optionally, materials of the first metal layer 223 and the second metal layer 225 can be pure metals or alloys, such as gold, silver, tungsten, molybdenum, iron, aluminum, aluminum-silicon, aluminum-titanium, etc.

Optionally, materials of the gate insulating layer 222 can include at least one of silicon nitride, silicon oxide, or organic photoresist.

Optionally, materials of the first flat layer 226 and the second flat layer 227 can be an organic transparent film layer, such as transparent photoresist, epoxy resin, polyimide, polyvinyl alcohol, polymethylmethacrylate, polystyrene, etc.

Optionally, materials of the first conductive layer 23 and the second conductive layer 16 can be oxides, such as indium tin oxide, indium zinc oxide, etc., and can also be metals, alloys, compounds, and mixtures thereof with various conductive properties. For example, gold, silver, platinum, etc. can be used.

In this embodiment, optionally, the pixel defining layer 24 respectively covers parts of the first conductive portion 261 and part of the second conductive portion 264.

Optionally, the at least one LED 25 includes a nano-LED.

Optionally, a length of the LED 15 ranges from 2 to 5 micrometers. For example, it can be 2 micrometers, 3 micrometers, 4 micrometers, or 5 micrometers. The width ranges from 100 to 500 nanometers. For example, it can be 100 nanometers, 200 nanometers, 300 nanometers, 400 nanometers, or 500 nanometers. The LED 25 is a rod-shaped structure, but is not limited thereto.

Optionally, referring to FIG. 3, the LED 25 further includes a semiconductor layer 253. The semiconductor layer 253 is connected between the first end 251 and the second end 252. The first end 251 is one of a P-type semiconductor and an N-type semiconductor. The second end 252 is the other one of the P-type semiconductor and the N-type semiconductor.

Optionally, neither the first conductive portion 261 nor the second conductive portion 262 is connected to the semiconductor layer 253 to prevent short circuits.

Referring to FIG. 4, the LED 25 can further include a protective layer 254. The protective layer 254 covers the semiconductor layer 253 and at most covers part of the first end 251 and at most covers part of the second end 252. That is to say, the LED 25 exposes at least part of the first end 251 and exposes at least part of the second end 252.

In the embodiment of the present application, the panel 200 can further include a fixing portion 27. The fixing portion 27 is disposed in the opening 241 and is fixedly connected to the LED 25, the first electrode 231, and the second electrode 232.

The fixing portion 27 fixes the LED 25 on the thin-film transistor layer 22.

Optionally, the fixing portion 27 includes a fixing material and a material configured to block etching. The fixing material is configured to fixedly connect the thin-film transistor layer 22 and the LED 25. The fixed material can be, for example, polymethyl methacrylate (PMMA) or butyl acrylate (BA). The material configured to block etching is configured to prevent etching, which can be silicon oxide nanoparticles.

Optionally, referring to FIG. 6, the panel 200 can further include a light conversion layer 28. The light conversion layer 28 is disposed in the opening 241 and covers the LED 25.

The light conversion layer 28 includes a red conversion unit, a green conversion unit, and a blue conversion unit. The LED 25 can emit blue light or violet light. A light emitted by the LED 25 excites a material of the light conversion layer 28, thereby emitting a corresponding color of light.

Optionally, the material of the light conversion layer 28 can be quantum dots. A material of the red conversion unit is red quantum dots. A material of the green conversion unit is green quantum dots. A material of the blue conversion unit is blue quantum dots.

In an embodiment, the light conversion layer 28 can also include the red conversion unit, the green conversion unit, and a light-transmitting material unit. LED 25 can emit blue light.

The panel 200 of an embodiment of the present application adopts a nano-level LED 25 as a light-emitting unit. The red and green pixels adopt quantum dots or other color conversion materials for color conversion, and ultimately form a red, green, and blue full-color display panel. LED 25 is a blue light nano-LED. The life service performance of each of the pixels is the same, which enhances the display taste and life service. At the same time, compared to the mini-LED panel, the panel 200 of this embodiment prevents steps of massive transfer and simplifies the process.

The panel 200 of an embodiment of the present application further includes an encapsulation layer 29. The encapsulation layer 29 covers the pixel defining layer 24 and the light conversion layer 28.

Figure 7:
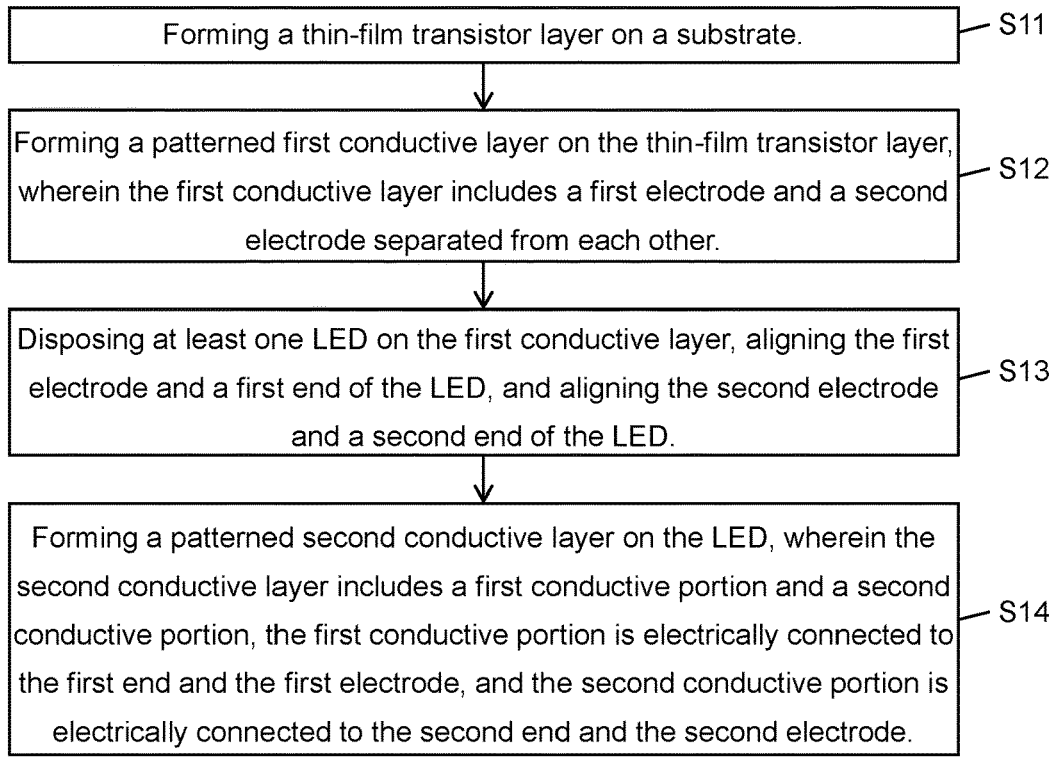
FIG. 7 is a flowchart of a first manufacturing method of the panel provided by an embodiment of the present application.

Referring to FIG. 7, correspondingly, an embodiment of the present application also relates to a first manufacturing method of a panel, including the following steps:

step S11: forming a thin-film transistor layer on the substrate;

step S12: forming a patterned first conductive layer on the thin-film transistor layer, the first conductive layer including a first electrode and a second electrode separated from each other;

step S13: disposing at least one LED on the first conductive layer, aligning the first electrode and a first end of the LED, and aligning the second electrode and a second end of the LED, wherein the first end and the second end are opposite to each other; and step S14: forming a patterned second conductive layer on the LED, wherein the second conductive layer includes a first conductive portion and a second conductive portion, the first conductive portion is electrically connected to the first end and the first electrode, and the second conductive portion is electrically connected to the second end and the second electrode.

The manufacturing method of the panel of an embodiment of the application adopts a structure of the LED being disposed on the thin-film transistor layer that replaces a mini-LED panel and a micro-LED panel in prior art, which prevents steps of massive transfer and simplifies the process so as to achieve an effect of simplifying a process. In addition, the above-mentioned structure has a longer service life than a simple electroluminescent display panel.

Figure 8:
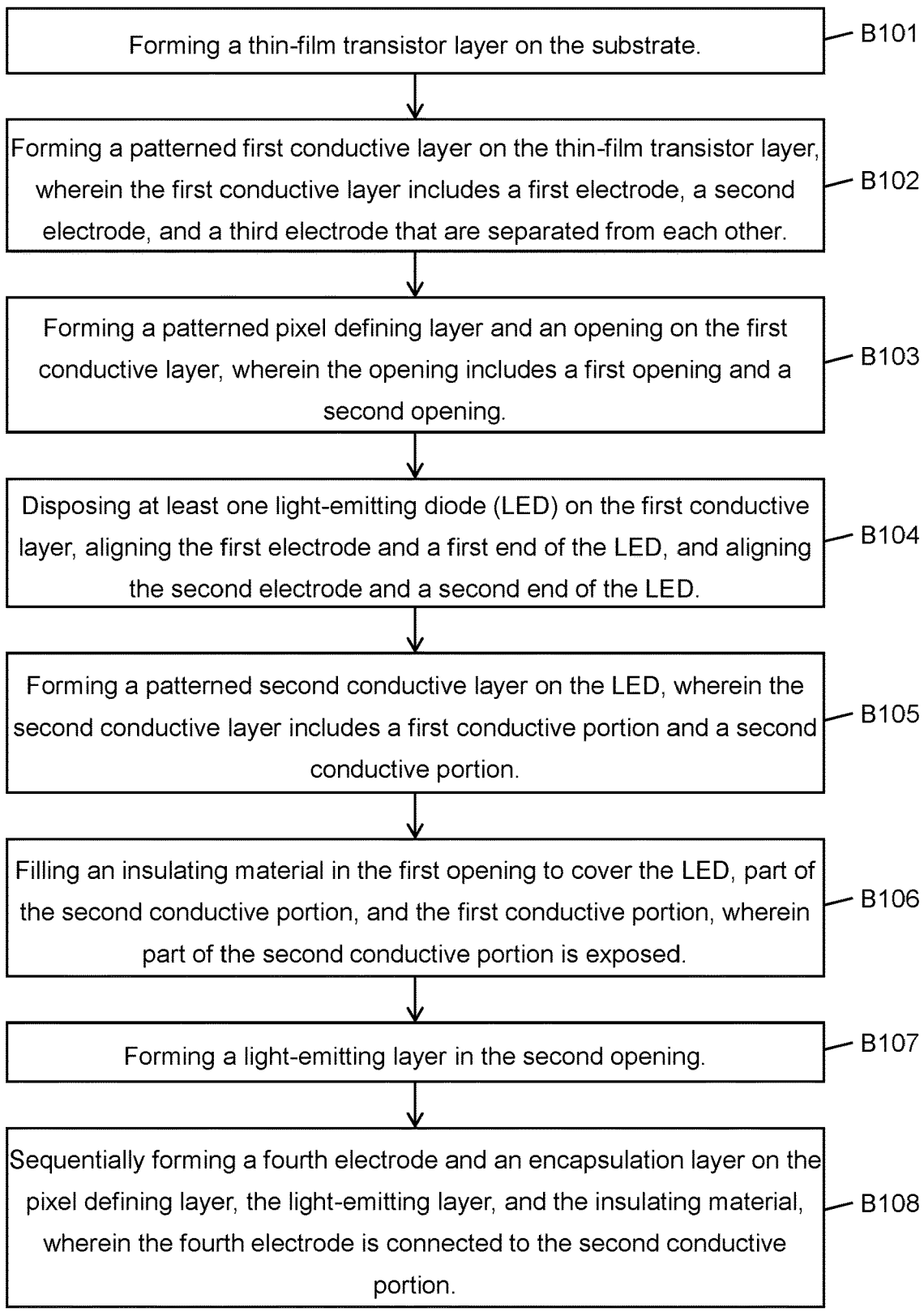
FIG. 8 is a flowchart of a second manufacturing method of the panel provided by an embodiment of the present application.
Figure 9:
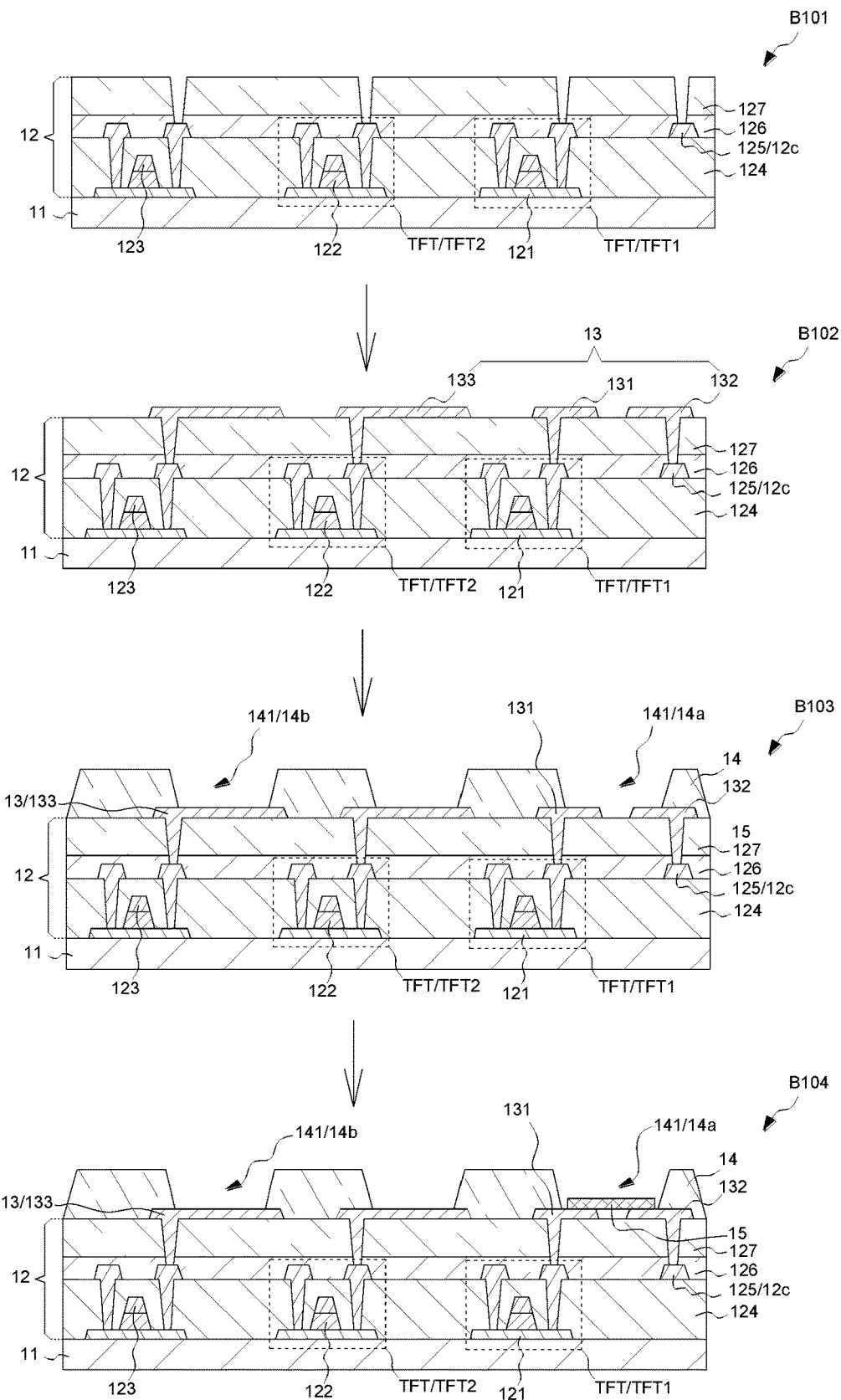
FIG. 9 is a schematic diagram of steps B101-B104 of the flowchart of the second manufacturing method of the panel provided by an embodiment of the present application.
Figure 10:
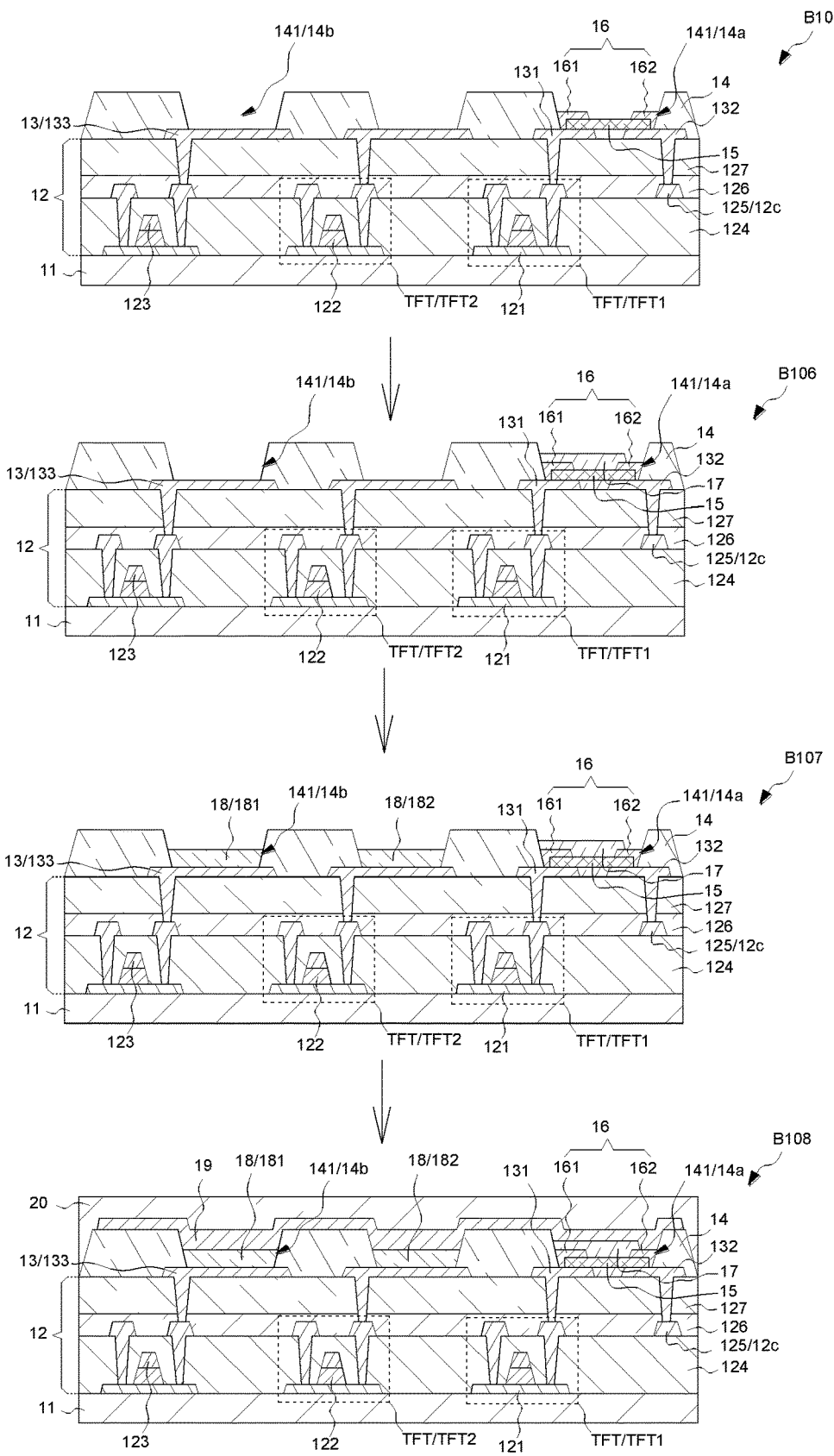
FIG. 10 is a schematic diagram of steps B105-B108 of the flowchart of the second manufacturing method of the panel provided by an embodiment of the present application.

Referring to FIGS. 8-10, correspondingly, an embodiment of the present application also relates to a second manufacturing method of the panel, including the following steps:

step B101: forming a thin-film transistor layer 12 on the substrate 11;

step B102: forming a patterned first conductive layer 13 on the thin-film transistor layer 12, and the first conductive layer 13 includes a first electrode 131, a second electrode 132, and a third electrode 133 that are separated from each other;

step B103: forming a patterned pixel defining layer 14 and an opening 141 on the first conductive layer 13, wherein the opening 141 includes a first opening 14a and a second opening 14b, the first opening 14a exposes the first electrode 131 and the second electrode 132, and the second opening 14b exposes the third electrode 133;

step B104: disposing at least one LED 15 on the first conductive layer 13, aligning the first electrode 131 and a first end 151 of the LED 15, and aligning the second electrode 132 and a second end 152 of the LED 15, wherein the first end 151 and the second end 152 are opposite to each other;

step B105: forming a patterned second conductive layer 16 on the LED 15, wherein the second conductive layer 16 includes a first conductive portion 161 and a second conductive portion 162, the first conductive portion 161 is electrically connected to the first end 151 and the first electrode 131, and the second conductive portion 162 is electrically connected to the second end 152 and the second electrode 132;

step B106: filling an insulating material 17 in the first opening 14a to cover the LED 15, part of the second conductive portion 162, and the first conductive portion 161, wherein part of the second conductive portion 162 is exposed;

step B107: forming a light-emitting layer 18 in the second opening 14b; and step B108: sequentially forming a fourth electrode 19 and an encapsulation layer 20 on the pixel defining layer 14, the light-emitting layer 18, and the insulating material 17, wherein the fourth electrode 19 is connected to the second conductive portion 162.

A second flowchart of the manufacturing method of the panel of the present application is described below. It should be noted that the manufacturing method of this embodiment is used to manufacture the panel 100 of the above-mentioned embodiment.

Referring to FIG. 9, step B101: forming the thin-film transistor layer 12 on the substrate 11. For specific structures of the substrate 11 and the thin-film transistor layer 12, please refer to relevant contents of the panel 100 of the above-mentioned embodiment, which will not be repeated here.

Optionally, the thin-film transistor layer 12 can be an oxide thin-film transistor layer, a low temperature polysilicon thin-film transistor layer, or an organic thin-film transistor layer. Proceed to step B102.

Step B102: forming the patterned first conductive layer 13 on the thin-film transistor layer 12. The first conductive layer 13 includes the first electrode 131, the second electrode 132, and the third electrode 133 that are separated from each other.

For a specific structure of the patterned first conductive layer 13, please refer to relevant contents of the panel 100 of the above-mentioned embodiment, which will not be repeated here. Proceed to step B103.

Step B103: forming the patterned pixel defining layer 14 and the opening 141 on the first conductive layer 13. The opening 141 includes the first opening 14a and the second opening 14b. The first opening 14a exposes the first electrode 131 and the second electrode 132. The second opening 14b exposes the third electrode 133.

Optionally, a material of the pixel defining layer 14 can be an organic photoresist material. Proceed to step B104.

Step B104: disposing at least one LED 15 on the first conductive layer 13, aligning the first electrode 131 and the first end 151 of the LED 15, and aligning the second electrode 132 and the second end 152 of the LED 15. The first end 151 and the second end 152 are opposite to each other.

Optionally, the LED 15 can be a nano-LED.

Optionally, the LED 15 is transported to the first opening 14a by adopting printing or microfluidic transmission. Subsequently, alignment techniques such as electric field force, magnetic field force, and surface tension are adopted to correspond ends of the LED 15 to the first electrode 131 and the second electrode 132, respectively. Afterwards, solvent brought by the printing or the microfluidic transmission is removed through a drying method. Proceed to step B105.

Referring to FIG. 10, step B105: forming the patterned second conductive layer 16 on the LED 15. The second conductive layer 16 includes the first conductive portion 161 and the second conductive portion 162. The first conductive portion 161 is electrically connected to the first end 151 and the first electrode 131, and the second conductive portion 162 is electrically connected to the second end 152 and the second electrode 132.

Optionally, a conductive material layer is formed on the LED 15 through inkjet printing or evaporation, and then photolithography or other methods can be used to form the patterned second conductive layer 16, so that the first end 151 and the second end 152 is connected to the first electrode 131 and the second electrode 132, respectively. Proceed to step B106.

Step B106: filling the insulating material 17 in the first opening 14a to cover the LED 15, part of the second conductive portion 162, and the first conductive portion 161. Part of the second conductive portion 162 is exposed.

Optionally, the insulating material 17 has good packaging properties. Proceed to step B107.

Step B107: forming the light-emitting layer 18 in the second opening 14b.

Optionally, a material of the light-emitting layer 18 can be an organic material or an inorganic material.

Optionally, the LED 15 can be a blue light-emitting LED. The light-emitting layer 18 can include a red light-emitting layer 181 and a green light-emitting layer 182. Since a light-emitting performance of the LED 15 is better than a light-emitting performance of blue quantum dots, red quantum dots and green quantum dots are adopted as the light-emitting layer 18. Adopting the blue light-emitting LED 15 to replace the blue quantum dots can achieve matching of performance and the service life, thereby enhancing an overall service life and taste of the panel 100.

Proceed to step B108.

Step B108: sequentially forming the fourth electrode 19 and the encapsulation layer 20 on the pixel defining layer 14, the light-emitting layer 18, and the insulating material 17. The fourth electrode 19 is connected to the second conductive portion 162.

In this way, the second manufacturing method of the panel of an embodiment of the present application is completed.

Figure 11:
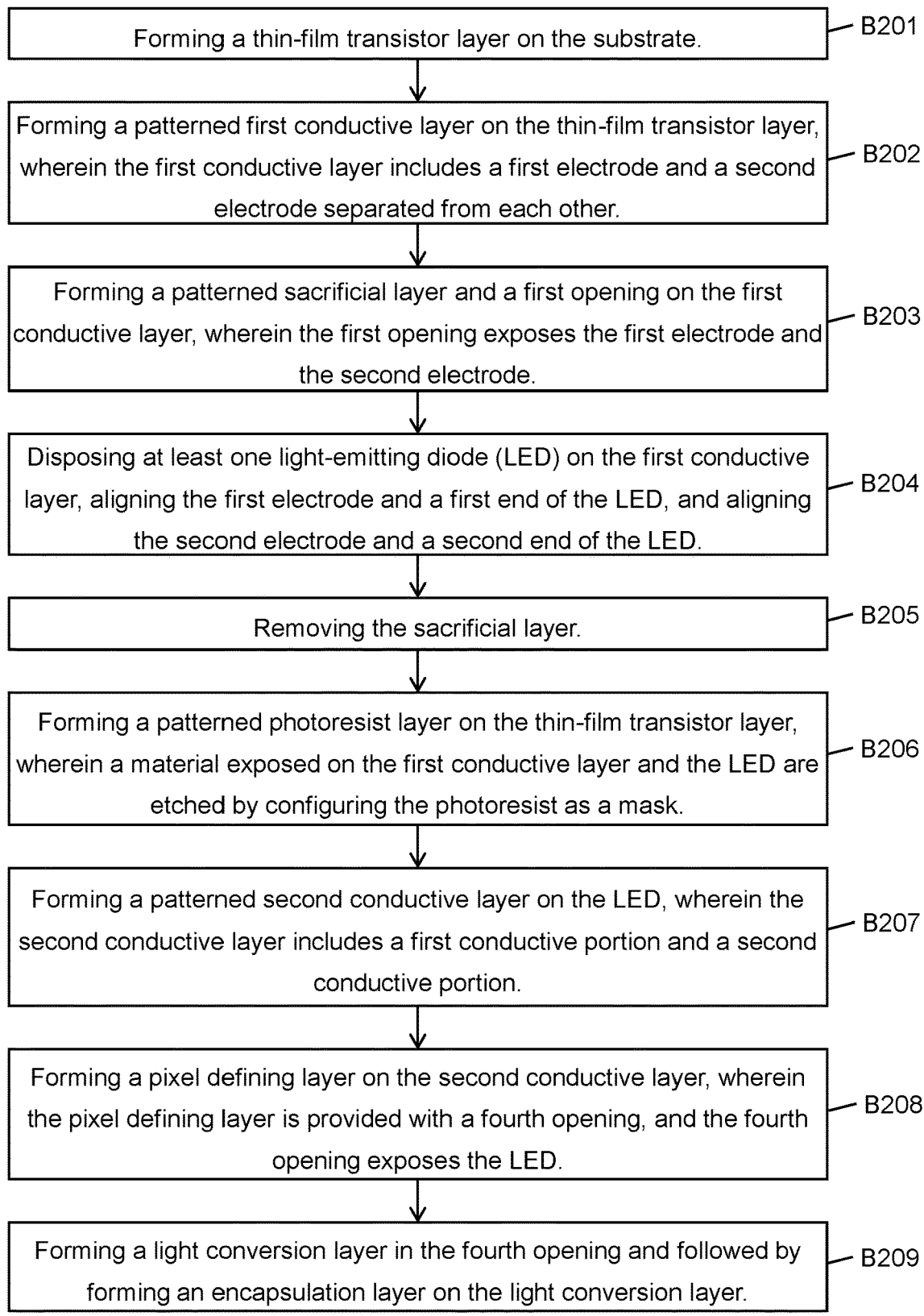
FIG. 11 is a flowchart of a third manufacturing method of the panel provided by an embodiment of the present application.
Figure 12:
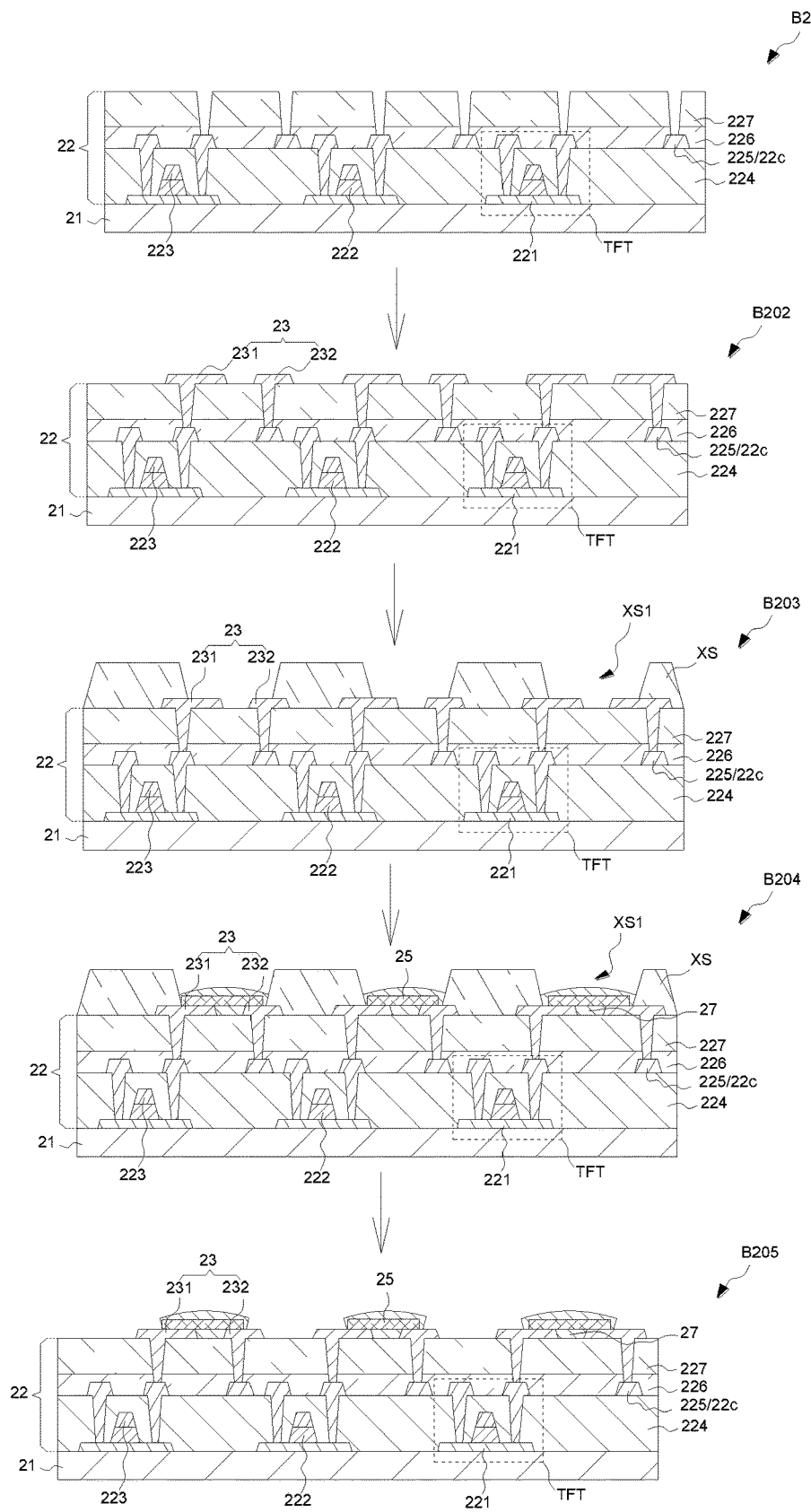
FIG. 12 is a schematic diagram of steps B201-B205 of the flowchart of the third manufacturing method of the panel provided by an embodiment of the present application.
Figure 13:
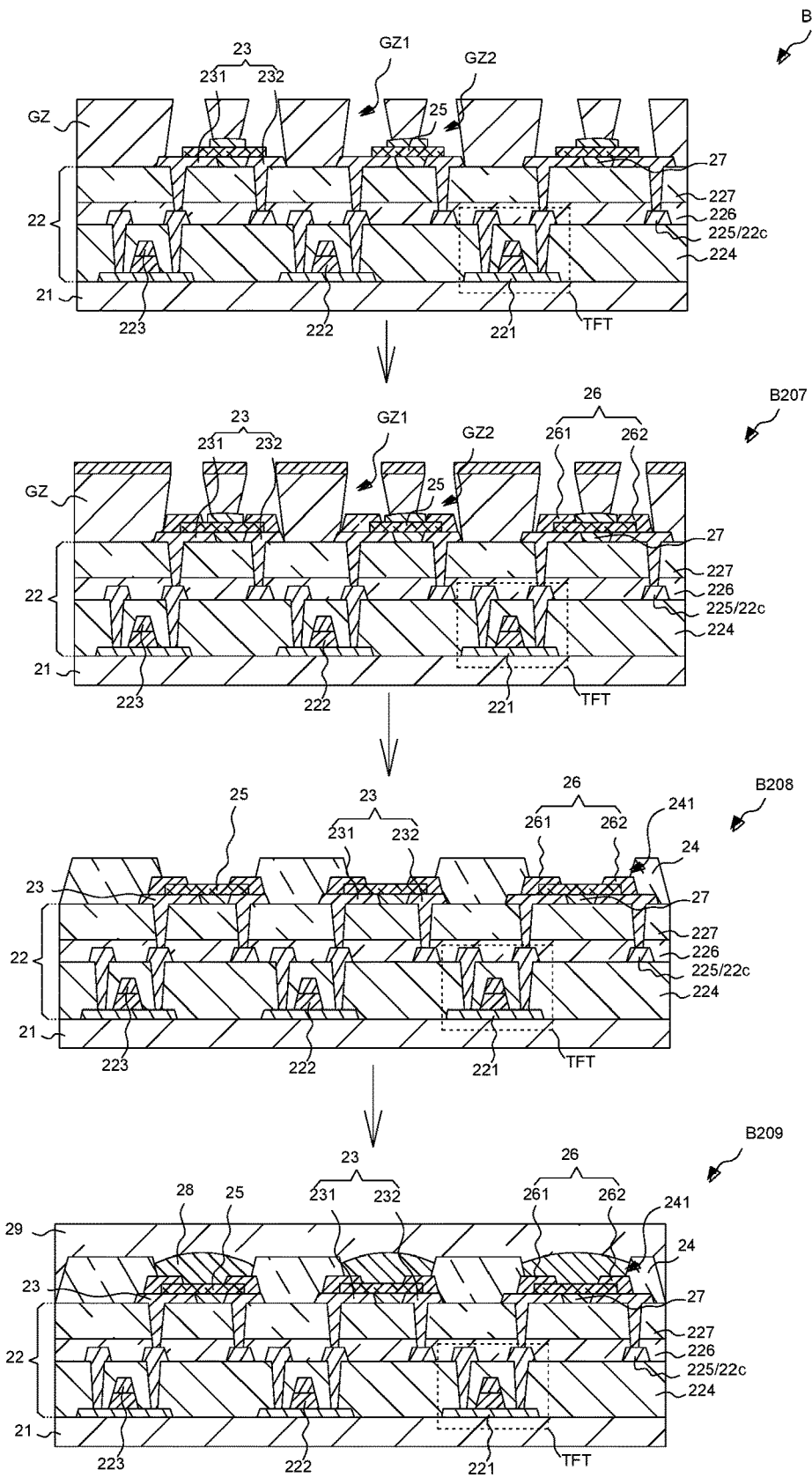
FIG. 13 is a schematic diagram of steps B206-B209 of the flowchart of the third manufacturing method of the panel provided by an embodiment of the present application.

Referring to FIGS. 11-13, a third manufacturing method of the panel of an embodiment of the present application includes the following steps:

step B201: forming a thin-film transistor layer 22 on the substrate 21;

step B202: forming a patterned first conductive layer 23 on the thin-film transistor layer 22, wherein the first conductive layer 23 includes a first electrode 231 and a second electrode 232 that are separated from each other;

step B203: forming a patterned sacrificial layer XS and a first opening XS1 on the first conductive layer 23, wherein the first opening XS1 exposes the first electrode 231 and the second electrode 232;

step B204: disposing at least one LED 25 on the first conductive layer 23, aligning the first electrode 231 and a first end 251 of the LED 25, and aligning the second electrode 232 and a second end 252 of the LED 25, wherein the first end 251 and the second end 252 are opposite to each other;

step B205: removing the sacrificial layer XS;

step B206: forming a patterned photoresist layer GZ on the thin-film transistor layer 22, wherein a material exposed on the first conductive layer 23 and the LED 25 are etched by configuring the photoresist layer GZ as a mask, the photoresist layer GZ is provided with a second opening GZ1 and a third opening GZ2, the second opening GZ1 corresponds to the first electrode 231 and the first end 251 of the LED 25, and the third opening GZ2 corresponds to the second electrode 232 and the second end 252 of the LED 25;

step B207: forming a patterned second conductive layer 26 on the LED 25, wherein the second conductive layer 26 includes a first conductive portion 261 and a second conductive portion 262, the first conductive portion 261 is electrically connected to the first end 251 and the first electrode 231, and the second conductive portion 262 is electrically connected to the second end 252 and the second electrode 232;

step B208: forming a pixel defining layer 24 on the second conductive layer 26, wherein the pixel defining layer 24 is provided with a fourth opening 241, and the fourth opening 241 exposes the LED 25; and step B209: forming a light conversion layer 28 in the fourth opening 241 and followed by forming an encapsulation layer 29 on the light conversion layer 28.

The manufacturing method of the panel of the above-mentioned embodiment is described below. It should be noted that the third manufacturing method of the panel of an embodiment of the present application is used to manufacture the panel 200 of the above-mentioned embodiment.

Referring to FIG. 12, step B201: forming the thin-film transistor layer 22 on the substrate 21.

For a specific structure of the substrate 21 and the thin-film transistor layer 22, please refer to related contents of the panel 200 of the above-mentioned embodiment, which will not be repeated here.

Optionally, the thin-film transistor layer 22 can be an oxide thin-film transistor layer, a low temperature polysilicon thin-film transistor layer, or an organic thin-film transistor layer. Proceed to step B202.

Step B202: forming the patterned first conductive layer 23 on the thin-film transistor layer 22. The first conductive layer 23 includes the first electrode 231 and the second electrode 232 that are separated from each other.

For a specific structure of the patterned first conductive layer 23, please refer to related contents of the panel 200 of the above-mentioned embodiment, which will not be repeated here. Proceed to step B203.

Step B203: forming the patterned sacrificial layer XS and the first opening XS1 on the first conductive layer 23. The first opening XS1 exposes the first electrode 231 and the second electrode 232.

Optionally, a material of the sacrificial layer XS can be an organic photoresist material. Proceed to step 204.

Step B204: disposing at least one LED 25 on the first conductive layer 23, aligning the first electrode 231 and the first end 251 of the LED 25, and aligning the second electrode 232 and the second end 252 of the LED 25. The first end 251 and the second end 252 are opposite to each other.

Optionally, step 204 includes:

disposing an LED solution RY in the first opening XS1 to cover the first conductive layer XS1, wherein the LED solution RY includes the LED 25, a solvent, a fixing material, and a material configured to block etching;

aligning the first electrode 231 and the first end 251 of the LED 25 and aligning the second electrode 232 and the second end 252 of the LED 25; and drying the LED solution RY and removing the solvent, wherein the fixing material and the material configured to block etching form the fixing portion 27, so as to enable the LED 25 to be fixed on the thin-film transistor layer 22 by the fixing material.

Optionally, the LED solution RY is transported to the first opening XS1 by adopting printing or microfluidic transmission. Subsequently, alignment techniques such as electric field force, magnetic field force, and surface tension are adopted to correspond ends of the LED 25 to the first electrode 231 and the second electrode 232, respectively. Afterwards, the solvent brought by the printing or the microfluidic transmission is removed through a drying method. Proceed to step 205.

Step B205: removing the sacrificial layer XS. Proceed to step B206.

Referring to FIG. 13, step B206: forming the patterned photoresist layer GZ on the thin-film transistor layer 22. The material exposed on the first conductive layer 23 and the LED 25 are etched by configuring the photoresist layer GZ as a mask. The photoresist layer GZ is provided with a second opening GZ1 and a third opening GZ2. The second opening GZ1 corresponds to the first electrode 231 and the first end 251 of the LED 25. The third opening GZ2 corresponds to the second electrode 232 and the second end 252 of the LED 25.

After etching, the first electrode 231, the second electrode 232, the first end 251 of the LED 25, and the second end 252 of the LED 25 are exposed. Proceed to step B207.

Step B207: forming the patterned second conductive layer 26 on the LED 25. The second conductive layer 26 includes the first conductive portion 261 and the second conductive portion 262. The first conductive portion 261 is electrically connected to the first end 251 and the first electrode 231. The second conductive portion 262 is electrically connected to the second end 252 and the second electrode 232.

Optionally, the photoresist layer GZ includes an undercut structure GZ2. Optionally, the undercut structure GZ2 is a hollow structure with chamfers.

Step B207 includes:

forming a conductive material layer on the photoresist layer GZ, wherein the conductive material layer covers the first electrode 231 and the first end 251 of the LED 25, and covers the second electrode 232 and the second end 252 of the LED 25; and removing the photoresist layer GZ and forming the patterned second conductive layer 26 to enable the first conductive portion 261 to be electrically connected to the first end 251 and the first electrode 231, and enable the second conductive portion 262 to be electrically connected to the second end 252 and the second electrode 232.

Since the photoresist layer GZ includes the undercut structure GZ2, the conductive material layer is luminously broken at where the undercut structure GZ2 is when a film is formed, so as to directly peel off the photoresist layer GZ, and then peel off the conductive material layer on the photoresist layer GZ, thereby forming the patterned second conductive layer 26, and saving photomasks.

Proceed to step B208.

Step B208: forming the pixel defining layer 24 on the second conductive layer 26. The pixel defining layer 24 is provided with the fourth opening 241. The fourth opening 241 exposes the LED 25. The pixel defining layer 24 respectively covers part of the first conductive portion 261 and part of the second conductive portion 262.

The fourth opening 241 is an opening of the panel 200. Proceed to step B209.

Step B209: forming the light conversion layer 28 in the fourth opening 241 and followed by forming the encapsulation layer 29 on the light conversion layer 28.

The light conversion layer 28 includes a red conversion unit, a green conversion unit, and a blue conversion unit. The LED 25 can emit blue light or violet light. A light emitted by the LED 25 excites a material of the light conversion layer 28, thereby emitting a corresponding color of light.

Optionally, the material of the light conversion layer 28 can be quantum dots. A material of the red conversion unit is red quantum dots. A material of the green conversion unit is green quantum dots. A material of the blue conversion unit is blue quantum dots.

In an embodiment, the light conversion layer 28 can also include the red conversion unit, the green conversion unit, and a light-transmitting material unit. LED 25 can emit blue light.

In this way, a third manufacturing method of the panel of an embodiment of the present application is completed.

The panel and the manufacturing method thereof provided by the present application are described in detail above, the specific examples of this document are used to explain principles and embodiments of the present application, and the description of embodiments above is only for helping to understand the present application. Meanwhile, those skilled in the art will be able to change the specific embodiments and the scope of the present application according to the idea of the present application. In the above, the content of the specification should not be construed as limiting the present application. Above all, the content of the specification should not be the limitation of the present application.

What is claimed is:

1. A panel, comprising: a substrate;
a thin-film transistor layer disposed on the substrate and comprising a plurality of thin-film transistors;
a first conductive layer disposed on the thin-film transistor layer and comprising a first electrode and a second electrode separated from each other, wherein the first electrode is electrically connected to one of the thin-film transistors;
a pixel defining layer disposed on the first conductive layer and provided with an opening;
at least one light-emitting diode (LED) disposed in the opening, wherein the LED comprises a first end and a second end opposite to each other, the first end is disposed on the first electrode, and the second end is disposed on the second electrode; and
a second conductive layer disposed on the LED and comprising a first conductive portion and a second conductive portion, wherein the first conductive portion is electrically connected to the first end and the first electrode, and the second conductive portion is electrically connected to the second end and the second electrode.

2. The panel according to claim 1, further comprising an insulating material, wherein the opening comprises a first opening, the LED is disposed in the first opening, and the insulating material is disposed in the first opening and covers the LED, part of the second conductive portion, and the first conductive portion.

3. The panel according to claim 2, wherein the first conductive layer further comprises a third electrode, the opening further comprises a second opening, and the second opening exposes the third electrode; and the panel further comprises a light-emitting layer and a fourth electrode, the light-emitting layer is disposed in the second opening, the fourth electrode covers the pixel defining layer, the light-emitting layer, and the insulating material, and the fourth electrode is connected to the second conductive portion.

4. The panel according to claim 3, wherein the LED comprises a blue LED, and the light-emitting layer comprises a red light-emitting layer and a green light-emitting layer.

5. The panel according to claim 3, wherein the thin-film transistors comprise a first thin-film transistor and a second thin-film transistor, the thin-film transistor layer further comprises a common line, the first thin-film transistor is electrically connected to the first electrode, the common line is electrically connected to the second electrode, and the second thin-film transistor is electrically connected to the third electrode.

6. The panel according to claim 1, further comprising a fixing portion disposed in the opening and fixedly connected to the LED, the first electrode, and the second electrode.

7. The panel according to claim 6, wherein the fixing portion comprises a fixing material and a material configured to block etching.

8. The panel according to claim 1, further comprising a light conversion layer disposed in the opening and covering the LED.

9. The panel according to claim 1, wherein the LED further comprises a semiconductor layer and a protective layer, the semiconductor layer is connected between the first end and the second end, and the protective layer covers the semiconductor layer, at most covers part of the first end, and at most covers part of the second end.

10. The panel according to claim 1, wherein the pixel defining layer covers part of the first conductive portion and part of the second conductive portion.

11. The panel according to claim 1, wherein the LED further comprises a semiconductor layer connected between the first end and the second end, and the first conductive portion and the second conductive portion are not connected to the semiconductor layer.

12. The panel according to claim 11, wherein the LED further comprises a protective layer covering the semiconductor layer, at most covering part of the first end, and at most covering part of the second end.

13. The panel according to claim 1, wherein a material of the second conductive layer comprises one of a metal oxide, a metal, an alloy, a compound, or a combination thereof.

14. The panel according to claim 1, wherein the LED comprises a nano-LED.

15. A manufacturing method of a panel, comprising steps of: forming a thin-film transistor layer on the substrate;
forming a patterned first conductive layer on the thin-film transistor layer, wherein the first conductive layer comprises a first electrode and a second electrode separated from each other;
disposing at least one light-emitting diode (LED) on the first conductive layer, aligning the first electrode and a first end of the LED, and aligning the second electrode and a second end of the LED, wherein the first end and the second end are opposite to each other; and
forming a patterned second conductive layer on the LED, wherein the second conductive layer comprises a first conductive portion and a second conductive portion, the first conductive portion is electrically connected to the first end and the first electrode, and the second conductive portion is electrically connected to the second end and the second electrode.

16. The manufacturing method of the panel according to claim 15, wherein the first conductive layer further comprises a third electrode; before the step of disposing at least one LED on the first conductive layer, the manufacturing method of the panel further comprises a step of: forming a patterned pixel defining layer and an opening on the first conductive layer, wherein the opening comprises a first opening and a second opening, the first opening exposes the first electrode and the second electrode, and the second opening exposes the third electrode;
after the step of forming the patterned second conductive layer on the LED, the manufacturing method of the panel further comprises steps of: filling an insulating material in the first opening to cover the LED, part of the second conductive portion, and the first conductive portion, wherein part of the second conductive portion is exposed;
forming a light-emitting layer in the second opening; and
sequentially forming a fourth electrode and an encapsulation layer on the pixel defining layer, the light-emitting layer, and the insulating material, wherein the fourth electrode is connected to the second conductive portion.

17. The manufacturing method of the panel according to claim 15, wherein before the step of disposing at least one LED on the first conductive layer, the manufacturing method of the panel further comprises a step of: forming a patterned sacrificial layer and a first opening on the first conductive layer, wherein the first opening exposes the first electrode and the second electrode;
the step of disposing at least one LED on the first conductive layer, aligning the first electrode and the first end of the LED, and aligning the second electrode and the second end of the LED comprises steps of: disposing an LED solution in the first opening to cover the first conductive layer, wherein the LED solution comprises the LED, a solvent, a fixing material, and a material configured to block etching;
aligning the first electrode and the first end of the LED and aligning the second electrode and the second end of the LED; and
drying the LED solution and removing the solvent to enable the LED to be fixed on the thin-film transistor layer by the fixing material.

18. The manufacturing method of the panel according to claim 17, wherein after the step of drying the LED solution, the manufacturing method of the panel further comprises steps of: removing the sacrificial layer; and
forming a patterned photoresist layer on the thin-film transistor layer, wherein a material exposed on the first conductive layer and the LED are etched by configuring the photoresist as a mask, the photoresist layer is provided with a second opening and a third opening, the second opening corresponds to the first electrode and the first end of the LED, and the third opening corresponds to the second electrode and the second end of the LED.

19. The manufacturing method of the panel according to claim 18, wherein the photoresist layer comprises an undercut structure; and the step of forming the patterned second conductive layer on the LED comprises steps of: forming a conductive material layer on the photoresist layer to cover the first electrode, the first end of the LED, the second electrode, and the second end of the LED; and
removing the photoresist layer and forming the patterned second conductive layer to enable the first conductive portion to be electrically connected to the first end and the first electrode and enable the second conductive portion to be electrically connected to the second end and the second electrode.

20. The manufacturing method of the panel according to claim 19, wherein after the step of removing the photoresist layer, the manufacturing method of the panel further comprises steps of: forming a pixel defining layer on the second conductive layer, wherein the pixel defining layer is provided with a fourth opening, and the fourth opening exposes the LED; and
forming a light conversion layer in the fourth opening and followed by forming an encapsulation layer on the light conversion layer.

* * * * *